(12) United States Patent
Wang

(10) Patent No.: US 10,490,606 B2
(45) Date of Patent: Nov. 26, 2019

(54) DISPLAY SUBSTRATE, DISPLAY PANEL, AND METHOD FOR FABRICATING THE DISPLAY SUBSTRATE

(71) Applicant: BOE Technology Group Co., Ltd., Beijing (CN)

(72) Inventor: Huifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/770,655

(22) PCT Filed: Sep. 20, 2017

(86) PCT No.: PCT/CN2017/102519
§ 371 (c)(1),
(2) Date: Apr. 24, 2018

(87) PCT Pub. No.: WO2018/161526
PCT Pub. Date: Sep. 13, 2018

(65) Prior Publication Data
US 2019/0074330 A1  Mar. 7, 2019

(30) Foreign Application Priority Data
Mar. 6, 2017 (CN) .......................... 2017 1 0129014

(51) Int. Cl.
*H01L 29/08* (2006.01)
*H01L 27/32* (2006.01)
(Continued)

(52) U.S. Cl.
CPC .......... *H01L 27/3218* (2013.01); *H01L 21/77* (2013.01); *H01L 27/326* (2013.01);
(Continued)

(58) Field of Classification Search
None
See application file for complete search history.

(56) References Cited

U.S. PATENT DOCUMENTS

| 7,091,660 | B2 | 8/2006 | Park et al. |
| 9,214,505 | B2 * | 12/2015 | Higo ............... H01L 27/326 |

(Continued)

FOREIGN PATENT DOCUMENTS

| CN | 1452438 A | 10/2003 |
| CN | 101064335 A | 10/2007 |

(Continued)

OTHER PUBLICATIONS

English translation of ISR for PCT/CN2017/102519 dated Dec. 27, 2017.
(Continued)

*Primary Examiner* — Hung K Vu
(74) *Attorney, Agent, or Firm* — Arent Fox LLP; Michael Fainberg

(57) ABSTRACT

This disclosure provides a display substrate, a display panel, and a method for fabricating the display substrate. The display substrate includes: an underlying substrate; a plurality of sub-pixel areas arranged in an array on a surface of the underlying substrate; and an isolating layer arranged on the surface of the underlying substrate, wherein the isolating layer includes a surrounding dam arranged on a periphery of the plurality of sub-pixel areas, and a plurality of separating dams arranged in parallel on an inner side of the surrounding dam, end portions of the separating dams are spaced from the surrounding dam, and the plurality of sub-pixel areas are separated by the separating dams into a plurality of channels.

13 Claims, 8 Drawing Sheets

(51) Int. Cl.
*H01L 21/77* (2017.01)
*H01L 51/00* (2006.01)

(52) U.S. Cl.
CPC ...... *H01L 27/3211* (2013.01); *H01L 27/3246* (2013.01); *H01L 51/0005* (2013.01)

(56) References Cited

U.S. PATENT DOCUMENTS

| | | |
|---|---|---|
| 2003/0194484 A1 | 10/2003 | Yamazaki et al. |
| 2005/0142975 A1 | 6/2005 | Lee et al. |
| 2007/0085472 A1 | 4/2007 | Yamakawa et al. |
| 2007/0252518 A1 | 11/2007 | Lee et al. |
| 2011/0315971 A1 | 12/2011 | Rokuhara |
| 2012/0268005 A1 | 10/2012 | Furihata et al. |
| 2013/0062635 A1 | 3/2013 | Higo et al. |
| 2013/0234126 A1 | 9/2013 | Nakatani |
| 2014/0197396 A1* | 7/2014 | Madigan ............ H01L 51/0005 257/40 |
| 2016/0043150 A1 | 2/2016 | Wang et al. |
| 2016/0359112 A1 | 8/2016 | Wang et al. |

FOREIGN PATENT DOCUMENTS

| | | |
|---|---|---|
| CN | 102342182 A | 2/2012 |
| CN | 102577617 A | 7/2012 |
| CN | 102960068 A | 3/2013 |
| CN | 103000655 A | 3/2013 |
| CN | 103311269 A | 9/2013 |
| CN | 104465671 A | 3/2015 |
| CN | 106876437 A | 6/2017 |
| JP | 2010263054 A | 11/2010 |
| TW | 201141307 A | 11/2011 |

OTHER PUBLICATIONS

Chinese Office Action for corresponding Chinese Application 201710129014.7 dated Mar. 25, 2019.

* cited by examiner

DISPLAY SUBSTRATE, DISPLAY PANEL, AND METHOD FOR FABRICATING THE DISPLAY SUBSTRATE

This application is a National Stage of International Application No. PCT/CN2017/102519, filed Sep. 20, 2017, which claims the benefit of Chinese Patent Application No. 201710129014.7, filed with the Chinese Patent Office on Mar. 6, 2017, and entitled "A display substrate, a display panel, and a method for fabricating the display substrate", which are hereby incorporated by reference in their entireties.

FIELD

The present disclosure relates to the field of display technologies, and particularly to a display substrate, a display panel, and a method for fabricating the display substrate.

BACKGROUND

An Organic Light-Emitting Diode (OLED) display screen has been accepted as one of the next generation of display technologies with a promising prospect due to its advantages of a small thickness, a low weight, a wide angle of view, active light-emission, a consecutively tunable color of light emission, a low cost, a high response speed, low power consumption, low drive voltage, a wide range of operating temperature, a simple production process, high efficiency of light emission, a flexible display, etc.

Films at respective functional layers of the OLED display are generally formed in a vapor-plating process and a solution process. The vapor-plating process has been applied to the OLED display with a small size, and this process has been applied at present to massive production; and the films at the respective functional layers of the OLED display are generally formed in the solution process through inkjet printing, coating using a spray, spin-coating, grid printing, etc., where the technology of inkjet printing has been recognized as an important approach for massive production of the OLED with a large size due to its high utilization ratio of materials, and a large-size implementation.

SUMMARY

At least one embodiment of this disclosure provides a display substrate including: an underlying substrate, a plurality of sub-pixel areas arranged in an array on a surface of the underlying substrate, and an isolating layer arranged on the surface of the underlying substrate, wherein the isolating layer includes a surrounding dam arranged on a periphery of the plurality of sub-pixel areas, and a plurality of separating dams arranged in parallel on an inner side of the surrounding dam, end portions of the separating dams are spaced from the surrounding dam, and the plurality of sub-pixel areas are separated by the separating dams into a plurality of channels.

In some embodiment of this disclosure, there is a plurality of sub-pixels in a same color in each of the plurality of channels.

In some embodiment of this disclosure, the surrounding dam include a first surrounding dam and a second surrounding dam which are arranged parallel to the separating dams, and a third surrounding dam and a fourth surrounding dam which are arranged perpendicular to the separating dams, first protrusions are arranged respectively on an inner side of end portions of the first surrounding dam and the second surrounding dam, and both sides of end portions of the separating dams, and first recessions are formed on end portions of each of the plurality of channels.

In some embodiment of this disclosure, second protrusions are arranged respectively on an inner side of the surrounding dam and the second surrounding dam and two sides of each of the separating dams, and second recesses are formed between two adjacent sub-pixels of each of the plurality of channels.

In some embodiment of this disclosure, sealing areas are formed respectively on sides of the first recessions proximate to the third surrounding dam and the fourth surrounding dam, and a shape of the sealing areas is a round or a normal polygon.

In some embodiment of this disclosure, a pixel definition layer is arranged between the underlying substrate and the isolating layer, and the pixel definition layer is configured to space the sub-pixel areas from each other.

In some embodiment of this disclosure, a thickness of the pixel definition layer is 50 nm to 500 nm, and/or the pixel definition layer is a hydrophilic pixel definition layer.

In some embodiment of this disclosure, a thickness of the isolating layer is 500 nm to 1500 nm, and/or the isolating layer is a hydrophobic isolating layer.

At least one embodiment of this disclosure provides a display panel including the display substrate according to any one of the embodiments above.

At least one embodiment of this disclosure provides a method for fabricating a display substrate, the method including: forming an isolating layer on a surface of an underlying substrate, wherein the isolating layer includes a surrounding dam arranged on a periphery of a plurality of sub-pixel areas arranged in an array, and a plurality of separating dam arranged in parallel on an inner side of the surrounding dam, end portions of the separating dams are spaced from the surrounding dam, and the plurality of sub-pixel areas are separated by the separating dams into a plurality of channels.

In some embodiment of this disclosure, the surrounding dam includes a first surrounding dam and a second surrounding dam which are arranged parallel to the separating dams, and a third surrounding dam and a fourth surrounding dam which are arranged perpendicular to the separating dams, first protrusions are arranged respectively on an inner side of end portions of the first surrounding dam and the second surrounding dam and both sides of end portions of the separating dams, and first recessions are formed on end portions of each of the plurality of channels.

In some embodiment of this disclosure, before forming the isolating layer on the surface of the underlying substrate, the fabricating method further includes: forming a pixel definition layer on the surface of the underlying substrate, wherein the pixel definition layer is configured to space the plurality of sub-pixel areas from each other.

In some embodiment of this disclosure, after forming the isolating layer on the surface of the underlying substrate, the fabricating method further includes: jetting ink drops into the sub-pixel areas through inkjet printing to form a first functional layer, wherein the first functional layer of sub-pixels in different colors is made of a same material.

In some embodiment of this disclosure, the fabricating method further includes: forming a sealing adhesive in sealing areas of the plurality of channels of sub-pixels in a first color; and jetting ink drops into a surface of the first functional layer in each of the sub-pixel areas through inkjet printing to form a second functional layer, wherein the second functional layer of the sub-pixels in the first color is made of a material which is different from that of the second functional layer of the sub-pixels in other colors.

In some embodiment of this disclosure, the fabricating method further includes: forming a sealing adhesive in sealing areas of end portions of each of the plurality of channels; and jetting ink drops into a surface of the second functional layer in each of the sub-pixel areas through inkjet printing to form a third functional layer, wherein the third functional layer of the sub-pixels in different colors is made of different materials.

BRIEF DESCRIPTION OF THE DRAWINGS

In order to make the technical solutions according to the embodiments of this disclosure or in the related art more apparent, the drawings to which a description of the embodiments or the related art refers will be briefly introduced below, and apparently the drawings to be described below are merely illustrative of some embodiments of this disclosure, and those ordinarily skilled in the art can derive from these drawings other drawings without any inventive effort.

DETAILED DESCRIPTION OF THE EMBODIMENTS

The technical solutions according to the embodiments of this disclosure will be described below clearly and fully with reference to the drawings in the embodiments of this disclosure. Apparently the embodiments to be described are only a part but all of the embodiments of this disclosure. Based upon the embodiments here of this disclosure, all of other embodiments which can occur to those ordinarily skilled in the art without any inventive effort shall come into the scope of this disclosure as claimed.

Figure 1:
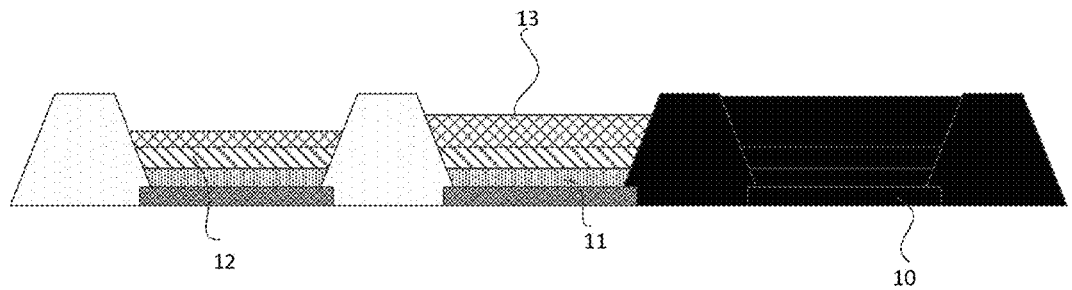
FIG. 1 is a schematic structural diagram of a display substrate in the related art in a sectional view.

FIG. 1 illustrates a schematic diagram of an OLED device in the related art, where the OLED device is fabricated through inkjet printing by coating a Hole Injection Layer (HIL) 11, a Hole Transfer Layer (HTL) 12, and a light-Emitting Layer (EML) 13 respectively on the surface of an anode layer 10 according to the thicknesses of the respective layers designed for the OLED device, and theoretically there are at most nine functional layers with different thicknesses to be coated. However in a real application, in order to simplify the fabrication process of the device, to save the cost of materials, and to lower the complexity of equipment, and the difficulty of process debugging, the materials and thicknesses of some functional layers tend to be the same, and for example, each pixel element includes three R, G, and B sub-pixels, there is the same material of the HIL layer of each sub-pixel, the material of the HTL layer of the B sub-pixel is different from those of the R and G sub-pixels, and there is a different material of the EML layer of each sub-pixel.

Figure 2:
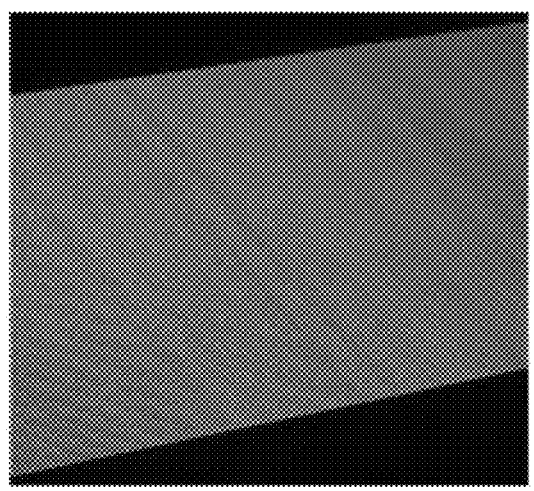
FIG. 2 is a schematic diagram of non-uniform brightness on a display device in the related art.
Figure 3:
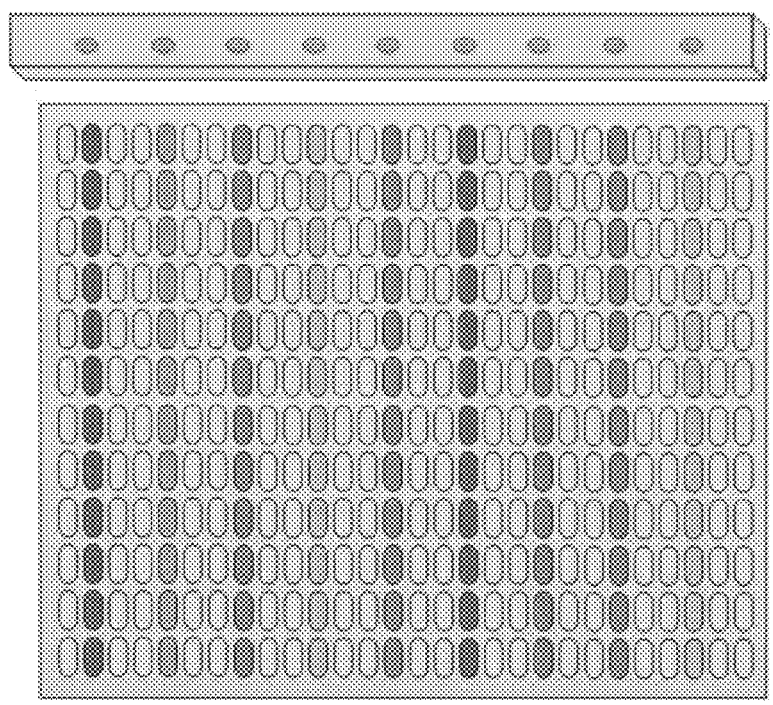
FIG. 3 is a schematic diagram of non-uniform brightness across pixels of a display panel in the related art.

Typically when a sprayer of an inkjet printing device is shipped from a factory, all the amounts of inkjet of respective nozzles may not be the same, so the amount of inkjet of each nozzle in the sprayer shall be corrected precisely before an inkjet printing operation is performed, and a volume error across the nozzles shall not exceed 0.3%; and once the volume error across the nozzles goes beyond the range, there may be non-uniform thicknesses of the functional layers across the sub-pixels in the same color, thus resulting in such a difference in brightness of light emission across the pixels that can be distinguished by human eyes, as illustrated in FIG. 2 and FIG. 3, which would degrade the uniformity of brightness on the OLED device.

At present, each sprayer is typically provided with 256 or 512 nozzles by a manufacturer of an inkjet printing device, and when the resolution of a massively produced OLED display device is 3840*2160, if a sprayer with 256 nozzles is applied thereto, then 15 nozzles shall be provided for monochromatic printing in the dimension of 3840 pixels; and a volume error across 3840 nozzles shall be controlled within 0.3%, and a volume error across 256 nozzles shall be corrected to within 0.3%, which will take 3 to 5 hours. Apparently the volumes of the 3840 nozzles will be corrected in a long and iterative process, which may take a long period of time and a high cost, and once an error beyond the rated range occurs in the correction process, the display quality of the OLED device may be degraded, thus discouraging the experience of a user.

Figure 4:
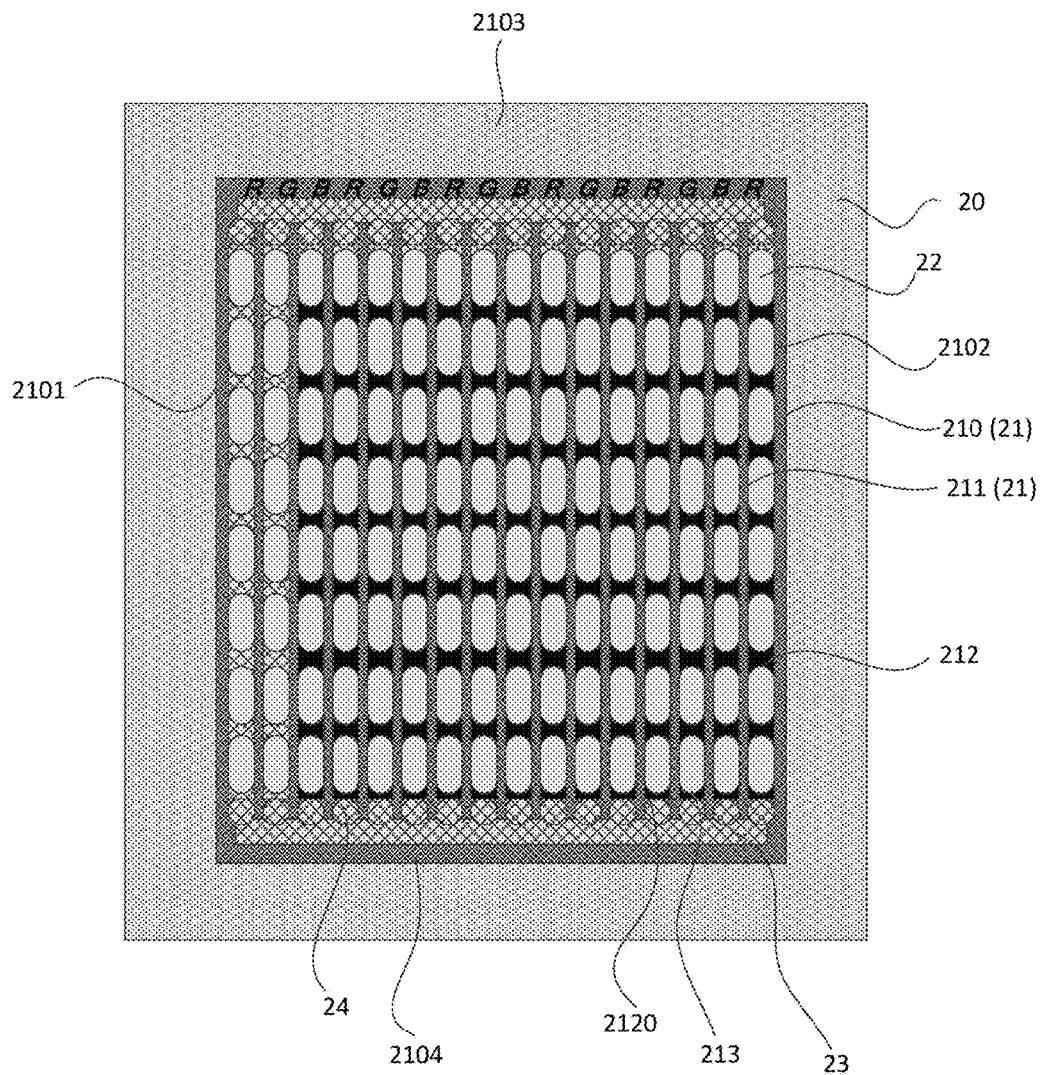
FIG. 4 is a schematic structural diagram of a display panel according to an embodiment of this disclosure.

As illustrated in FIG. 4, a display substrate according to an embodiment of this disclosure includes an underlying substrate 20, a plurality of sub-pixel areas 22 arranged in an array on the surface of the underlying substrate 20, an isolating layer 21 arranged on the surface of the underlying substrate 20, where the isolating layer 21 includes a surrounding dam 210 arranged on the periphery of the plurality of sub-pixel areas 22, and a plurality of separating dams 211 arranged in parallel on inner side of the surrounding dam 210, end portions of the separating dams 211 are spaced from the surrounding dam 210, and the plurality of sub-pixel areas 22 are separated by the separating dams 211 into a plurality of channels 212.

In the embodiment of this disclosure, the plurality of sub-pixel areas are separated by the separating dams at the isolating layer into the plurality of channels; and when functional layers of sub-pixels are formed through inkjet printing, if the functional layers of the sub-pixels in different colors are made of the same material, then ink drops may be jetted into each channel, and since the plurality of channels are communicated with each other, the ink drops can flow freely throughout the plurality of channels until their volumes are uniform. As compared with the related art in which a volume error across the nozzles of the inkjet printing device shall be corrected strictly, the precision of controlling a volume error across nozzles in an inkjet printing process can be greatly lowered in the embodiment of this disclosure to thereby lower the difficulty of fabricating a display panel, and also alleviating non-uniform brightness on the display panel from arising from such a volume error across the nozzles that disagrees with the precision condition, so as to improve the display quality of the display panel.

It shall be noted that there may be a plurality of sub-pixels in the same color, or a plurality of sub-pixels in different colors, in each channel 212. In an optional implementation, there is a plurality of sub-pixels in the same color in each channel.

Figure 5:
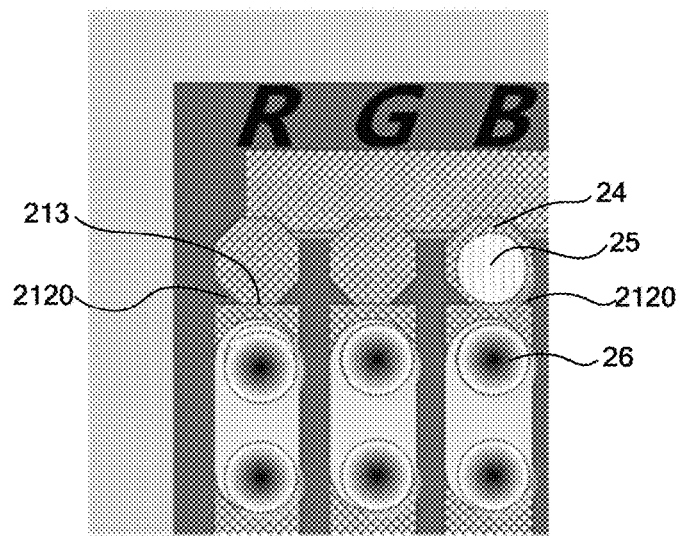
FIG. 5 is a schematic structural diagram of a part of the display panel in FIG. 4.

As illustrated in FIG. 4 and FIG. 5, in an optional embodiment of this disclosure, the surrounding dam 210 includes a first surrounding dam 2101, and a second surrounding dam 2102, which are arranged parallel to the separating dams 211, and a third surrounding dam 2103, and a fourth surrounding dam 2104, which are arranged perpendicular to the separating dams 211, where first protrusions 2120 are arranged respectively on the inner side of end portions of the first surrounding dam 2101 and the second surrounding dam 2102, and both sides of end portions of the respective separating dams 211, so that first recessions 213 are formed on end portions of the respective channels 212. In the embodiment above, the end portions of the separating dams are spaced from the surrounding dam so that the plurality of channels 212 are communicated with each other through the space, and when the functional layers of the sub-pixels are formed through inkjet printing, if the functional layers of the sub-pixels in different colors are made of the same material, then the ink drops can flow freely throughout the plurality of channels until their volumes are distributed uniformly. In this embodiment, the first recessions are formed on the end portions of the respective channels, and when all the functional layers of the sub-pixels in different colors are not made of the same material, a sealing adhesive can be applied in the first recessions of the channels where the functional layers of the sub-pixels are made of different materials, to thereby seal these channels, so that neither the ink in these channels can flow into the other channels, nor the ink in the other channels can flow into these channels. In this way, when the functional layers of the sub-pixels are formed through inkjet printing, the ink drops of the same material can flow freely through the plurality of channels, and the ink drops of different materials can only flow in the channels of their sub-pixels.

Further to the embodiment above, sealing areas 24 are formed respectively on the sides, of the first recessions 213 on both the ends of the respective channels 212, proximate to the third surrounding dam 2103 and the fourth surrounding dam 2104, where the sealing areas 24 will not be limited to any particular shape, and since the material of the sealing adhesive is typically an epoxy resin, etc., where the epoxy resin typically spreads out from a center while falling in drops, the shape of the sealing areas is optionally a round or a normal polygon, so that the sealing areas can be easily filled with the sealing adhesive to thereby seal their corresponding channels; and moreover the sealing areas 24 will not be limited to any particular area thereof, and any particular number thereof, but the area thereof, and the number thereof can be set as needed in reality in an optional implementation.

As can be appreciated, the epoxy resin can be UV-cured into the sealing adhesive.

Figure 6:
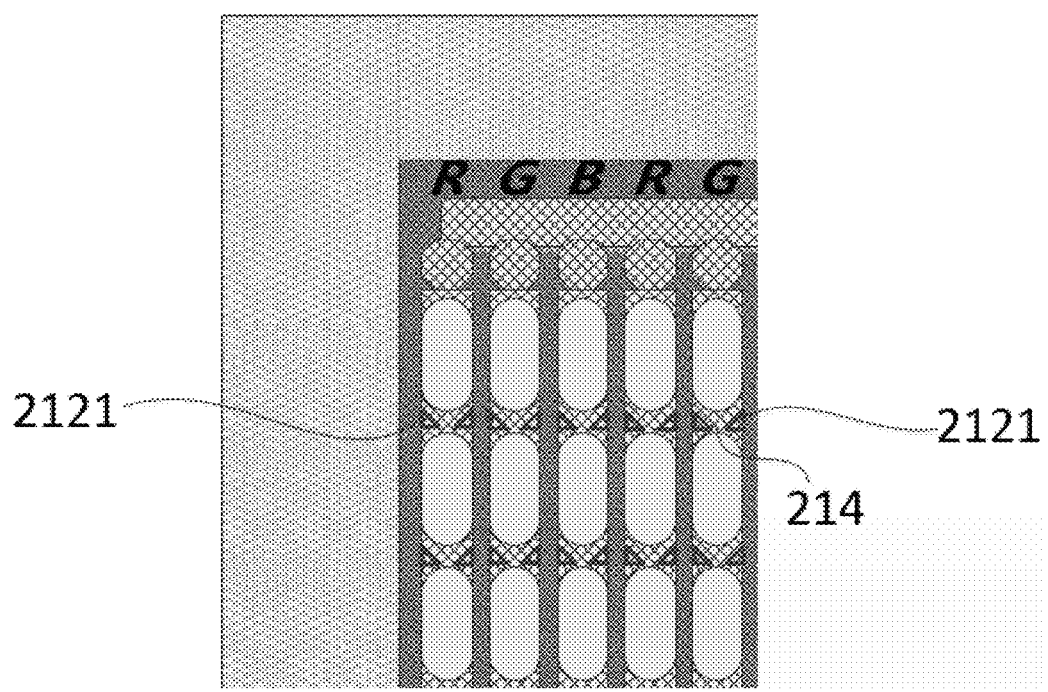
FIG. 6 is a schematic structural diagram of another part of the display panel in FIG. 4.

As illustrated in FIG. 4 and FIG. 6, in another optional embodiment of this disclosure, second protrusions 2121 are arranged respectively on the inner sides of the surrounding dam 2101 and the second surrounding dam 2102, and two sides of the respective separating dams 211, so that second recesses 14 are formed between two adjacent sub-pixels of the respective channels 212. With this design, when ink drops are jetted into the channels, the quantity of ink drops between two adjacent sub-pixels of a channel can be reduced to thereby save the ink drops to be used.

In an optional implementation, a pixel definition layer 23 is arranged between the underlying substrate 20 and the isolating layer 21, where the pixel definition layer 23 is configured to space the respective sub-pixel areas from each other. The pixel definition layer 23 will not be limited to any particular thickness, but the thickness thereof is typically 10 nm to 100 μm, and optionally 50 nm to 500 nm; and since the ink needs to flow and be spread in the channels, the pixel definition layer 23 is optionally a hydrophilic pixel definition layer, and can be made of silicon dioxide, etc., for example.

The isolating layer 21 will not be limited to any particular thickness, but the thickness thereof can be 100 nm to 100 μm, and optionally 500 nm to 1500 nm; and since the ink drops 26 should be poorly adhered to the isolating layer in the respective channels, the isolating layer is optionally a hydrophobic isolating layer, and can be made of a fluorin-containing resin, etc., for example.

An embodiment of this disclosure further provides a display panel including the display substrate according to any one of the embodiments above, where the display panel will not be limited to any particular type, and can be an OLED display panel or a liquid crystal display panel, for example. The display panel can be easily fabricated, and has a good display effect.

An embodiment of this disclosure further provides a method for fabricating a display substrate, where the method includes following step.

Forming an isolating layer on the surface of an underlying substrate; where the isolating layer includes surrounding dam arranged on the periphery of the plurality of sub-pixel areas which are arranged in an array, and a plurality of separating dams arranged in parallel on the inner side of the surrounding dam, end portions of the separating dams are spaced from the surrounding dam, and the plurality of sub-pixel areas are separated by the separating dams into a plurality of channels.

In a display panel fabricated using the fabricating method according to the embodiment of this disclosure, when functional layers of sub-pixels are formed through inkjet printing, if the functional layers of the sub-pixels in different colors are made of the same material, then ink drops may be jetted into each channel, and since the plurality of channels are communicated with each other, the ink drops can flow freely throughout the plurality of channels until their volumes are uniform. As compared with the related art in which a volume error across the nozzles of the inkjet printing device shall be corrected strictly, the precision of controlling a volume error across nozzles in an inkjet printing process can be greatly lowered in the embodiment of this disclosure to thereby lower the difficulty of fabricating the display panel, and also alleviating non-uniform brightness on the display panel from arising from such a volume error across the nozzles that disagrees with the precision condition, so as to improve the display quality of the display panel.

In an optional embodiment, the surrounding dam includes a first surrounding dam, and a second surrounding dam, which are arranged parallel to the separating dams, and a third surrounding dam, and a fourth surrounding dam, which are arranged perpendicular to the separating dams, where first protrusions are arranged respectively on the inner sides of end portions of the first surrounding dam and the second surrounding dam, and both sides of end portions of the respective separating dams, and first recessions are formed on end portions of the respective channels.

Here a process of forming the isolating layer will not be limited to any particular process, and can be spraying, plasma enhanced chemical vapor deposition, spin-coating, etc., for example.

In an optional embodiment, before the isolating layer is formed on the surface of the underlying substrate, the method for fabricating a display substrate further includes following step.

Forming a pixel definition layer on the surface of the underlying substrate, where the pixel definition layer is configured to space the plurality of sub-pixel areas from each other.

Where a process of forming the pixel definition layer will not be limited to any particular process, and can be spraying, plasma enhanced chemical vapor deposition, spin-coating, etc., for example.

Figure 7:
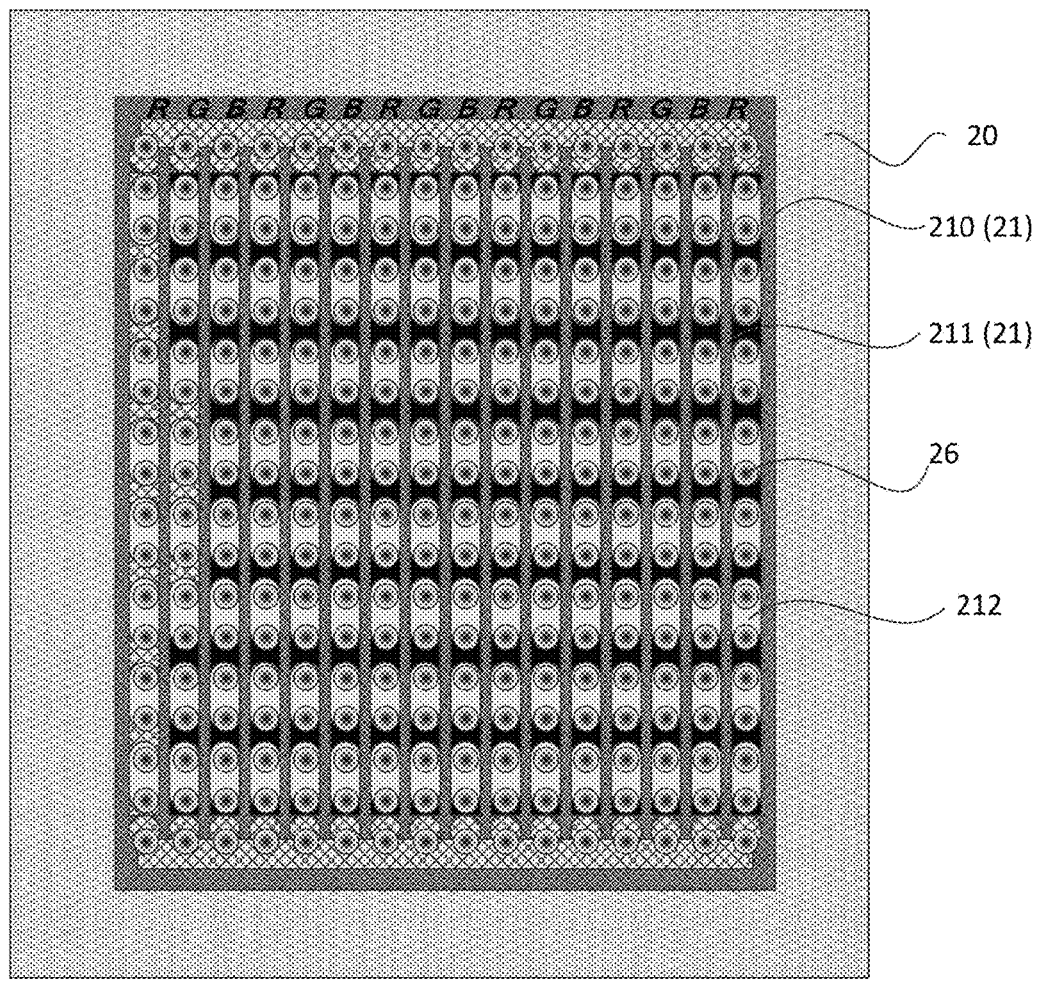
FIG. 7 is a schematic diagram of a first functional layer formed on sub-pixels of a display substrate according to an embodiment of this disclosure.

In another optional embodiment, referring to FIG. 7, after the isolating layer 21 is formed on the surface of the underlying substrate 20, the method for fabricating a display substrate further includes following step.

Jetting ink drops 26 into the sub-pixel areas 22 through inkjet printing to form a first functional layer, where the first functional layer of sub-pixels in different colors is made of the same material.

Figure 8:
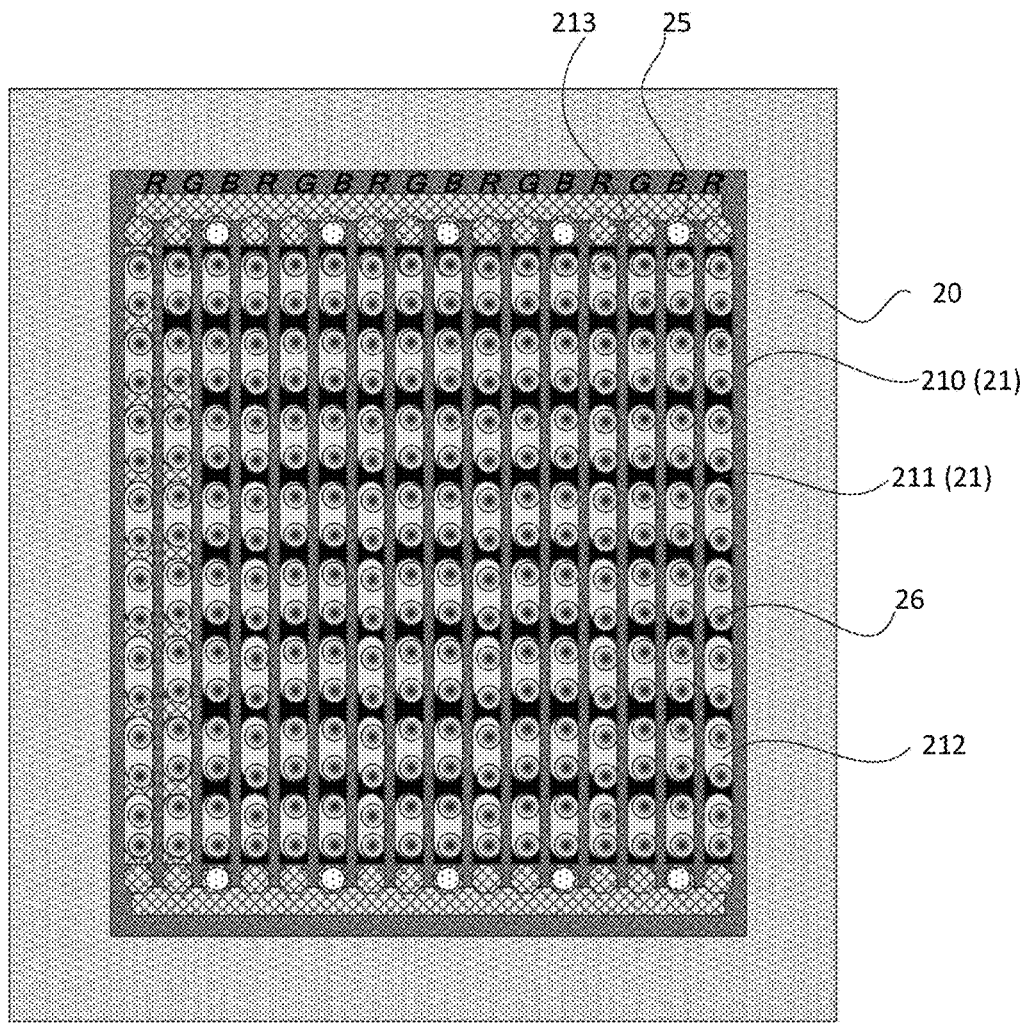
FIG. 8 is a schematic diagram of a second functional layer formed on sub-pixels of a display substrate according to an embodiment of this disclosure.

In an optional embodiment, referring to FIG. 8, the method for fabricating a display substrate further includes following steps.

Forming a sealing adhesive 25 in sealing areas 24 of the channels of sub-pixels in a first color; and jetting ink drops into the surface of the first functional layer in each sub-pixel area through inkjet printing to form a second functional layer, where the second functional layer of the sub-pixels in the first color is made of a different material from the second functional layer of the sub-pixels in the other colors.

Figure 9:
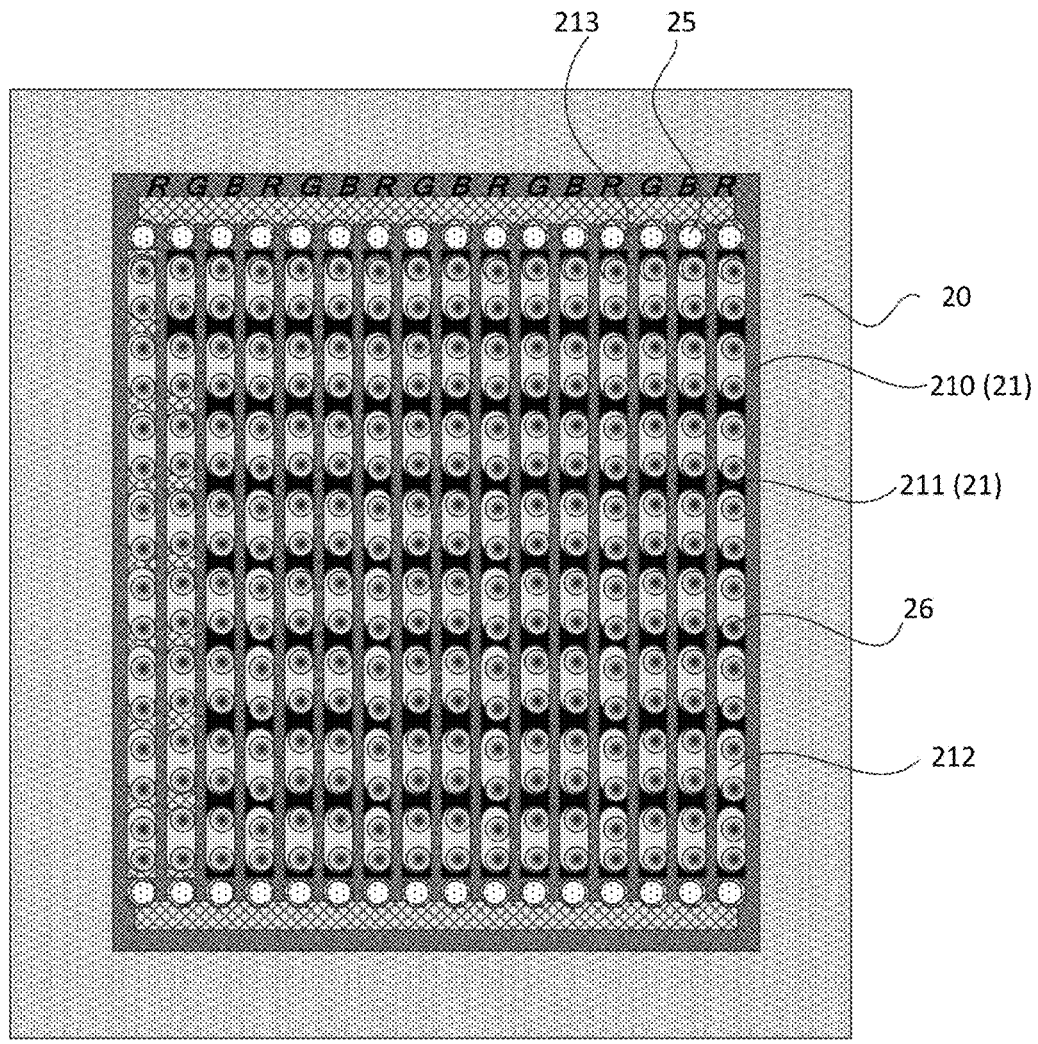
FIG. 9 is a schematic diagram of a third functional layer formed on sub-pixels of a display substrate according to an embodiment of this disclosure.

In an optional embodiment, referring to FIG. 9, the method for fabricating a display substrate further includes following steps.

Forming a sealing adhesive 25 in sealing areas 24 of the end portions of the respective channels; and jetting ink drops into the surface of the second functional layer in each sub-pixel area through inkjet printing to form a third functional layer, where the third functional layer of the sub-pixels in the different colors is made of different materials.

It shall be noted that the sealing adhesive can be formed in the first recessions of the respective channels, or can be formed in the sealing areas of the respective channels, as long as the channels can be sealed.

The method for fabricating a display substrate will be described below in connection with an optional embodiment thereof in which there are sub-pixels in three colors of R, G, and B, and there is a plurality of sub-pixels in the same color in each channel. As can be appreciated, this is only an optional embodiment of this disclosure, and any other embodiments which can be conceived without departing from the scope of this disclosure shall fall into the claimed scope of the embodiments of this disclosure.

Figure 10:
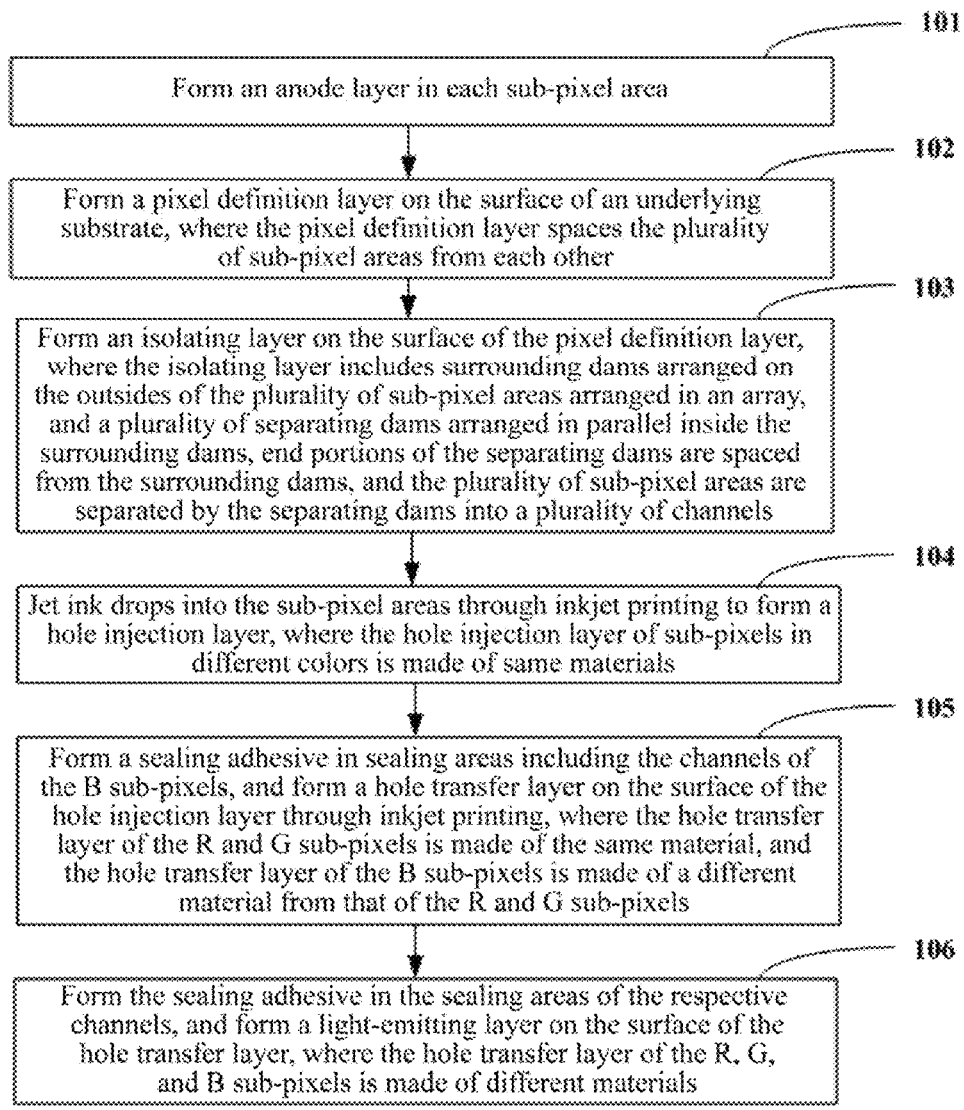
FIG. 10 is a flow chart of a method for fabricating a display substrate according to an embodiment of this disclosure.

As illustrated in FIG. 10, the method for fabricating a display substrate includes the following steps.

The step 101 is to form an anode layer in each sub-pixel area.

The step 102 is to form a pixel definition layer on the surface of an underlying substrate, where the pixel definition layer spaces the plurality of sub-pixel areas from each other.

The step 103 is to form an isolating layer on the surface of the pixel definition layer, where the isolating layer includes a surrounding dam arranged on the periphery of the plurality of sub-pixel areas which are arranged in an array, and a plurality of separating dams arranged in parallel on the inner side of the surrounding dam, end portions of the separating dams are spaced from the surrounding dam, and the plurality of sub-pixel areas are separated by the separating dams into a plurality of channels.

The step 104 is to jet ink drops into the sub-pixel areas through inkjet printing to form a hole injection layer, where the hole injection layer of sub-pixels in different colors is made of the same materials.

The step 105 is to form a sealing adhesive in sealing areas including the channels of the B sub-pixels, and to form a hole transfer layer on the surface of the hole injection layer through inkjet printing, where the hole transfer layer of the R and G sub-pixels is made of the same material, and the hole transfer layer of the B sub-pixels is made of a different material from the R and G sub-pixels.

The step 106 is to form the sealing adhesive in the sealing areas of the respective channels, and to form a light-emitting layer on the surface of the hole transfer layer, where the hole transfer layer of the R, G, and B sub-pixels is made of different materials.

It shall be lastly noted that the foregoing embodiments are merely intended to illustrate the technical solutions according to this disclosure, but not intended to limit this disclosure thereto; and although this disclosure has been described in details in connection with the foregoing embodiments thereof, those ordinarily skilled in the art shall appreciate that they still can modify the technical solutions recited in the respective embodiments above, or make equivalent substitutions for a part of the technical features therein; and the essences of the corresponding technical solutions will not depart from the spirit and scope of the respective embodiments of this disclosure due to these modifications or substitutions.

The invention claimed is:

1. A display substrate, comprising
   an underlying substrate;
   a plurality of sub-pixel areas arranged in an array on a surface of the underlying substrate; and
   an isolating layer arranged on the surface of the underlying substrate, wherein the isolating layer comprises a surrounding dam arranged on a periphery of the plurality of sub-pixel areas, and a plurality of separating dams arranged in parallel on an inner side of the surrounding dam, end portions of the separating dams are spaced from the surrounding dam, and the plurality of sub-pixel areas are separated by the separating dams into a plurality of channels;
   wherein the surrounding dam comprise a first surrounding dam and a second surrounding dam which are arranged parallel to the separating dams, and a third surrounding dam and a fourth surrounding dam which are arranged perpendicular to the separating dams, first protrusions are arranged respectively on an inner side of end portions of the first surrounding dam and the second surrounding dam, and both sides of end portions of the separating dams, and first recessions are formed on end portions of each of the plurality of channels.

2. The display substrate according to claim 1, wherein there is a plurality of sub-pixels in a same color in each of the plurality of channels.

3. The display substrate according to claim 1, wherein second protrusions are arranged respectively on an inner side of the surrounding dam and the second surrounding dam and two sides of each of the separating dams, and second recesses are formed between two adjacent sub-pixels of each of the plurality of channels.

4. The display substrate according to claim 1, wherein sealing areas are formed respectively on sides of the first recessions proximate to the third surrounding dam and the fourth surrounding dam, and a shape of the sealing areas is a round or a normal polygon.

5. The display substrate according to claim 1, wherein a pixel definition layer is arranged between the underlying substrate and the isolating layer, and the pixel definition layer is configured to space the sub-pixel areas from each other.

6. The display substrate according to claim 5, wherein a thickness of the pixel definition layer is 50 nm to 500 nm, and/or the pixel definition layer is a hydrophilic pixel definition layer.

7. The display substrate according to claim 1, wherein a thickness of the isolating layer is 500 nm to 1500 nm, and/or the isolating layer is a hydrophobic isolating layer.

8. A display panel, comprising the display substrate according to claim 1.

9. A method for fabricating the display substrate according to claim 1, the method comprises:
forming an isolating layer on a surface of an underlying substrate, wherein the isolating layer comprises a surrounding dam arranged on a periphery of a plurality of sub-pixel areas arranged in an array, and a plurality of separating dam arranged in parallel on an inner side of the surrounding dam, end portions of the separating dams are spaced from the surrounding dam, and the plurality of sub-pixel areas are separated by the separating dams into a plurality of channels;
wherein the surrounding dam comprise a first surrounding dam and a second surrounding dam which are arranged parallel to the separating dams, and a third surrounding dam and a fourth surrounding dam which are arranged perpendicular to the separating dams, first protrusions are arranged respectively on an inner side of end portions of the first surrounding dam and the second surrounding dam and both sides of end portions of the separating dams, and first recessions are formed on end portions of each of the plurality of channels.

10. The fabricating method according to claim 9, wherein before forming the isolating layer on the surface of the underlying substrate, the fabricating method further comprises:
forming a pixel definition layer on the surface of the underlying substrate, wherein the pixel definition layer is configured to space the plurality of sub-pixel areas from each other.

11. The fabricating method according to claim 10, wherein after forming the isolating layer on the surface of the underlying substrate, the fabricating method further comprises:
jetting ink drops into the sub-pixel areas through inkjet printing to form a first functional layer, wherein the first functional layer of sub-pixels in different colors is made of a same material.

12. The fabricating method according to claim 11, wherein the fabricating method further comprises:
forming a sealing adhesive in sealing areas of the plurality of channels of sub-pixels in a first color; and
jetting ink drops into a surface of the first functional layer in each of the sub-pixel areas through inkjet printing to form a second functional layer, wherein the second functional layer of the sub-pixels in the first color is made of a material which is different from that of the second functional layer of the sub-pixels in other colors.

13. The fabricating method according to claim 12, wherein the fabricating method further comprises:
forming a sealing adhesive in sealing areas of end portions of each of the plurality of channels; and
jetting ink drops into a surface of the second functional layer in each of the sub-pixel areas through inkjet printing to form a third functional layer, wherein the third functional layer of the sub-pixels in different colors is made of different materials.

* * * * *